US010706344B1

(12) United States Patent
Scruggs et al.

(10) Patent No.: US 10,706,344 B1
(45) Date of Patent: Jul. 7, 2020

(54) PROCESS FOR MAINTAINING REGISTRATION OF AN ARRAY THROUGH USE OF A CARRIER IN PROCESS FLOW

(71) Applicant: Fiteq, Inc., Tiburon, CA (US)

(72) Inventors: Michael Scruggs, Lakeland, FL (US); Robert Singleton, Lakeland, FL (US)

(73) Assignee: FITEQ, INC., Tiburon, CA (US)

( * ) Notice: Subject to any disclaimer, the term of this patent is extended or adjusted under 35 U.S.C. 154(b) by 277 days.

(21) Appl. No.: 15/603,422

(22) Filed: May 23, 2017

(51) Int. Cl.
  *H05K 3/30* (2006.01)
  *G06K 19/077* (2006.01)
  *H05K 3/28* (2006.01)
  *H05K 1/02* (2006.01)
  *H05K 3/00* (2006.01)

(52) U.S. Cl.
  CPC ....... *G06K 19/07722* (2013.01); *H05K 1/028* (2013.01); *H05K 3/0052* (2013.01); *H05K 3/284* (2013.01); *H05K 3/305* (2013.01); *H05K 2203/1316* (2013.01); *H05K 2203/1327* (2013.01); *H05K 2203/166* (2013.01); *Y10T 29/4913* (2015.01)

(58) Field of Classification Search
  CPC ........... G06K 19/07722; G06K 19/048; H05K 3/284; H05K 3/305; H05K 3/0052; H05K 1/028; H05K 2203/1316; H05K 2203/166; H05K 2203/1327; Y10T 29/49126; Y10T 29/49128; Y10T 29/49146
  USPC .................................. 29/830, 831, 832, 841
  See application file for complete search history.

(56) References Cited

U.S. PATENT DOCUMENTS

| 3,508,031 | A | | 4/1970 | Cooper, Jr. |
| 4,100,011 | A | | 7/1978 | Foote |
| 4,180,608 | A | | 12/1979 | Del |
| 4,999,742 | A | * | 3/1991 | Stampfli ............... G06K 19/048 361/728 |
| 6,819,099 | B1 | * | 11/2004 | Repko .................. G06F 11/2733 324/750.25 |
| 7,073,721 | B2 | * | 7/2006 | Kano ................... B29C 65/7808 235/487 |
| 7,267,926 | B2 | * | 9/2007 | Tsuruta ............ G06K 19/07749 355/18 |
| 2008/0197533 | A1 | | 8/2008 | Tsao et al. |
| 2011/0062239 | A1 | | 3/2011 | Lau et al. |
| 2014/0307404 | A1 | | 10/2014 | Singleton |
| 2015/0347891 | A1 | | 12/2015 | Foo et al. |

* cited by examiner

*Primary Examiner* — Donghai D Nguyen
(74) *Attorney, Agent, or Firm* — Roy L Anderson

(57) ABSTRACT

A sheet with registration holes cut in it is mounted to a surface of a pallet so that its registration holes are held taught by the outer diameter of bushings while an inner diameter pin shaft of the bushings is used by registration pins during multiple manufacturing process to provide registration of the sheet.

9 Claims, 7 Drawing Sheets

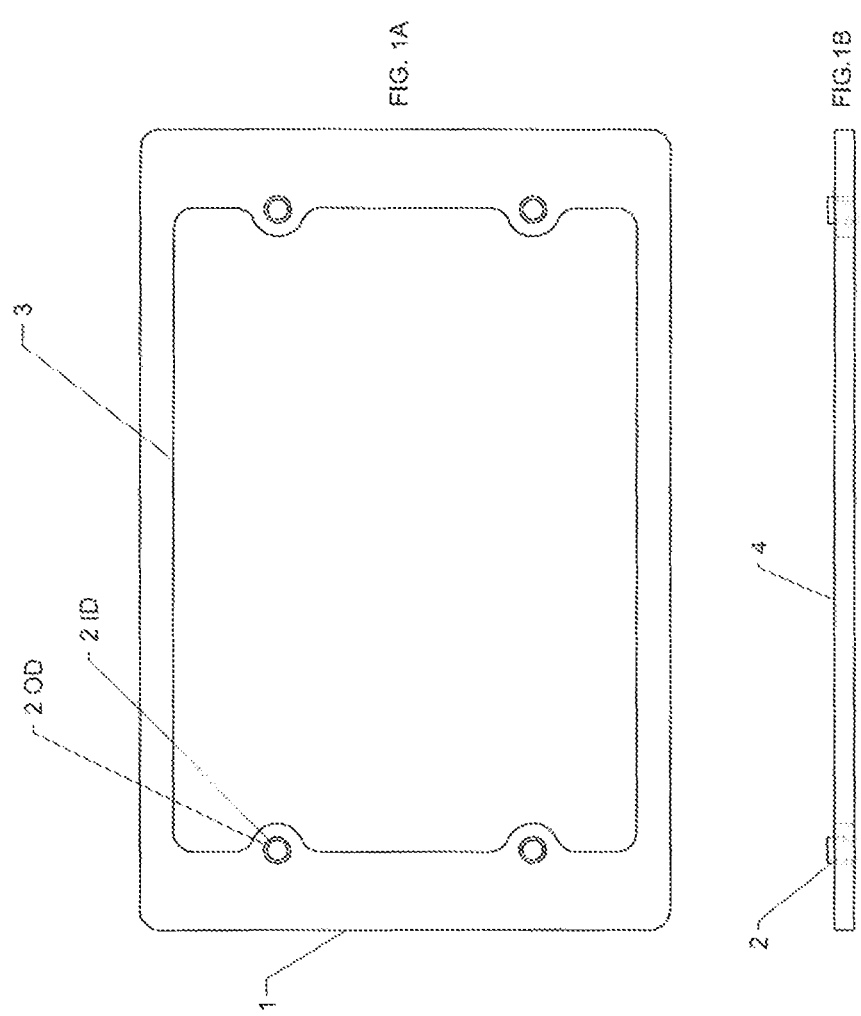

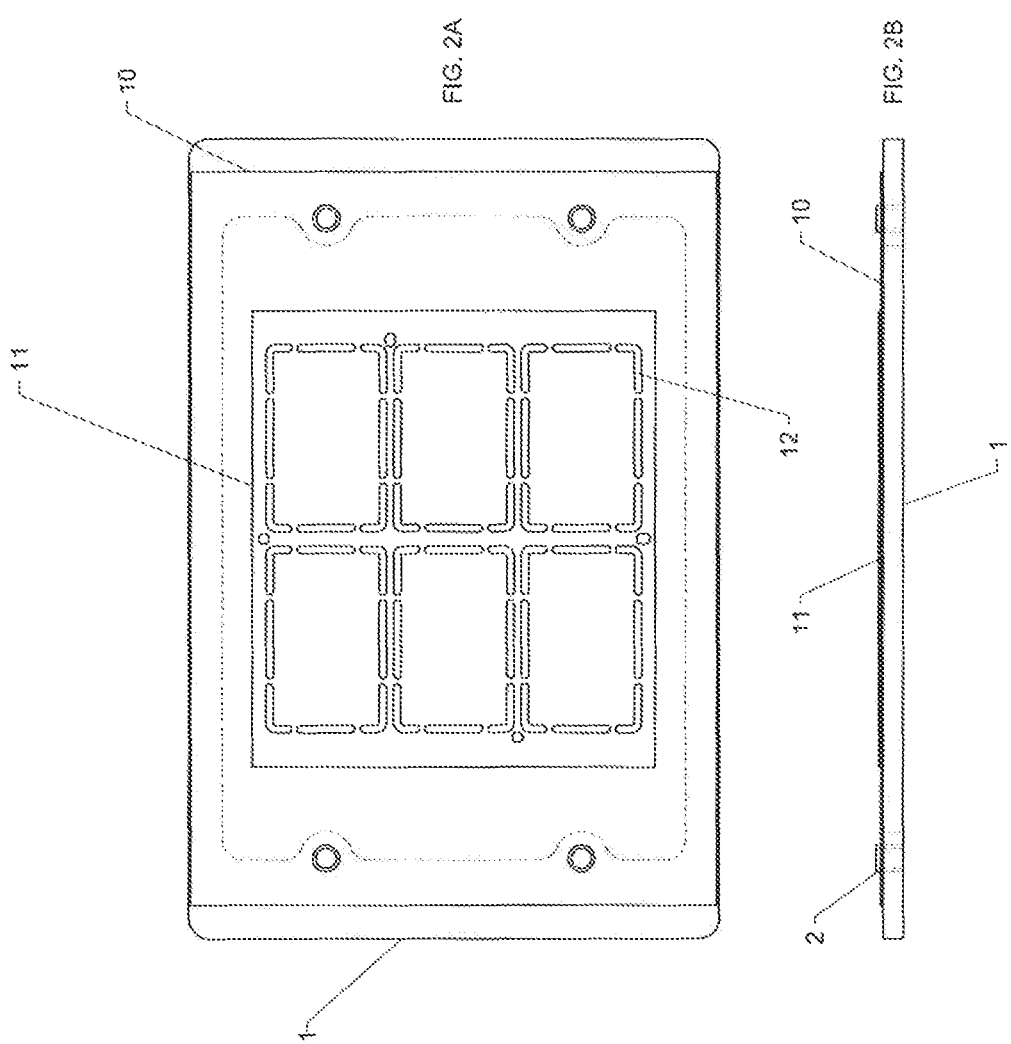

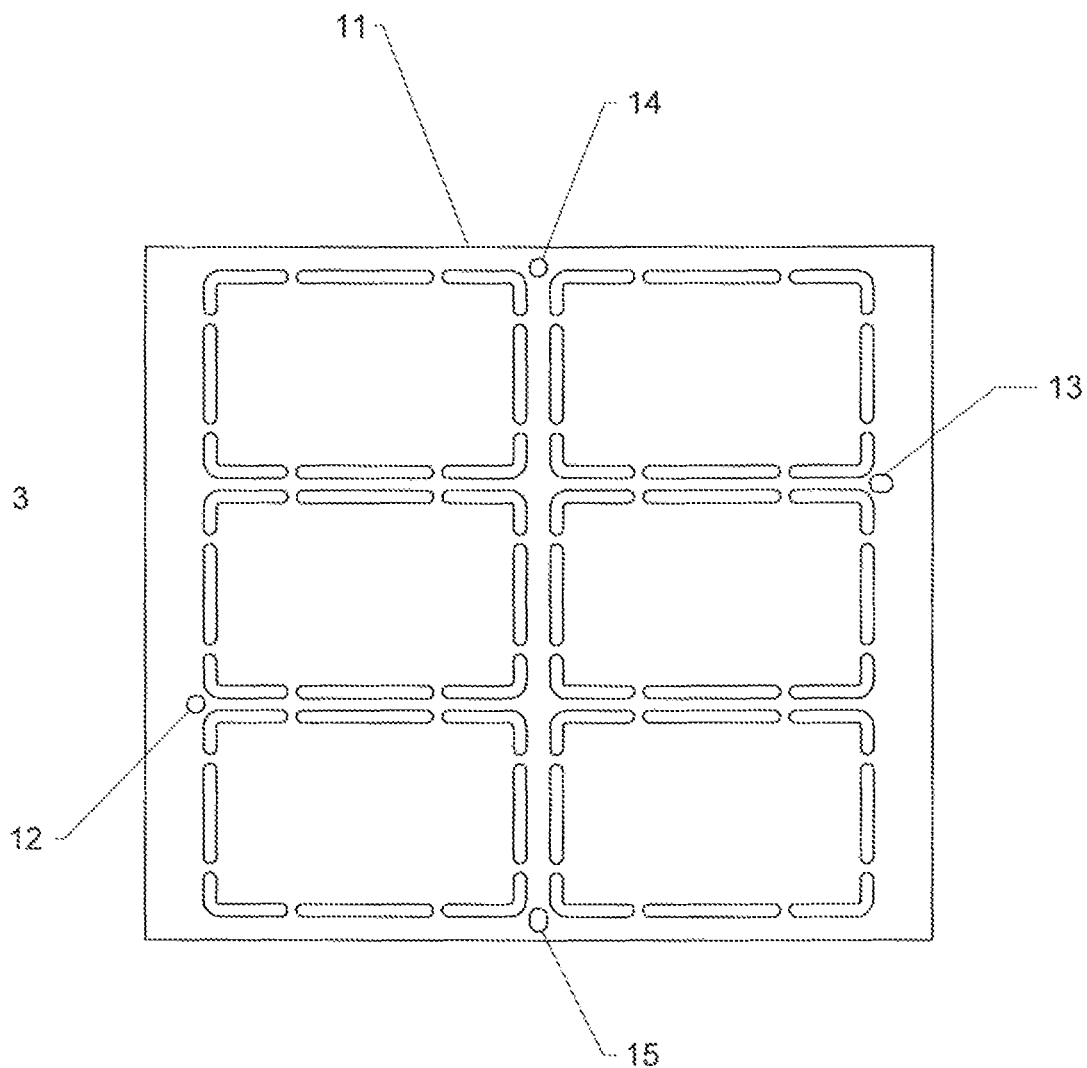

PROCESS FOR MAINTAINING REGISTRATION OF AN ARRAY THROUGH USE OF A CARRIER IN PROCESS FLOW

FIELD OF THE INVENTION

The present application is in the field of manufacturing processes involving a thin flexible sheet and, more particularly, to the manufacture of cards having electronic components contained within thin front and back sheets.

BACKGROUND OF THE INVENTION

Credit, debit and charge cards manufactured today often include EMV chips and there is a need to be able to efficiently manufacture such cards with electronic components that still comply with strict quality control standards required by card issuing organizations.

SUMMARY OF THE INVENTION

The present invention is generally directed to a process for manufacturing a laminated article of manufacture in which a sheet with registration holes cut in it is mounted to a surface of a pallet so that the registration holes are held taught by the outer diameter of the bushings while an inner diameter pin shaft of the bushings is used by registration pins during multiple processing steps or at multiple processing stations so as to provide registration of the sheet.

In a first, separate aspect of the present invention, a pick and place step places a circuit array on a sheet having adhesive and a vacuum is used during its placement to minimize air bubbles between the adhesive layer and the circuit array.

Accordingly, it is primary object of the present invention to provide an improved manufacturing process for an article of manufacture in which a circuit array is mounted to a thin flexible sheet.

This and further objects and advantages of the present invention will be apparent to those skilled in the art in connection with the drawing and the detailed description of the invention set forth below.

BRIEF DESCRIPTION OF THE DRAWINGS

FIG. 1A illustrates a pallet useful in the present invention while FIG. 1B is a cross section view of FIG. 1A.

FIG. 2A illustrates a thin sheet mounted to the pallet of FIG. 1 with a circuit array placed on top of the sheet while FIG. 2B is a cross section of FIG. 2A.

FIG. 3 illustrates the circuit array from FIG. 2A.

FIGS. 4A-E illustrate steps of a pick operation while

DETAILED DESCRIPTION OF THE INVENTION

Figure 4A:
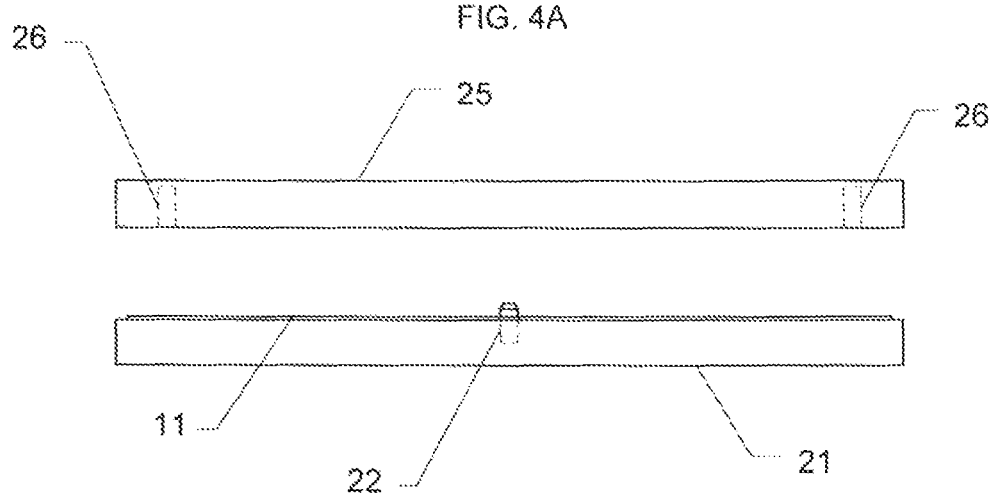

The present invention relates to manufacturing processes and, in an especially preferred embodiment, manufacturing processes capable of manufacturing cards that meet various certification standards, such as identification cards which must meet ISO/IEC 7810 Identification cards—Physical characteristics. Additionally, cards having magnetic stripes must meet parts of ISO/IEC 7811; cards used for financial transactions must meet ISO/IEC 7813, cards having integrated circuits with contacts must meet ISO/IEC 7816-1 and proximity cards must meet ISO/IEC 14443-1. All of these cards can be manufactured in accordance with the processes of the present invention, which are also applicable to any other process in which at least one thin sheet (e.g., a 3 mil sheet) is used as a layer upon which an article of manufacture is built during multiple processing steps and the sheet is moved between various processing steps in which precise alignment is critical to process control.

In accordance with the present invention, one or more thin sheets are pulled taut over an outer diameter of at least two (and preferably 4) bushings located in a pallet. The bushings are used throughout the process for registering the sheet without having to revisit the registration holes of the sheet. In subsequent steps, an inner diameter of the bushings serves to receive a registration pin in the various assembly steps to thereby insure proper registration of the sheet. The sheet remains on the pallet until the individual articles of manufacture, such as cards, are cut from the array. Use of the inner diameter of the bushings also allows for very precise registration because it does not change or become sloppy, unlike a hole in the sheet.

The present invention will now be described by reference to an especially preferred embodiment for manufacturing a payment card or the like having a front side, a back side and embedded electronics which must be placed on at least one of the sides of the cards. The process for manufacturing such a card can generally be described as having the following steps or operations:

Step 1: Preprinted top and bottom sheets (typically 3 mms thick) have registration holes cut in the sheets, as well as any hole needed for electronics. Each sheet has one or more arrays of cards (e.g., 6) in it.

Step 2: Each sheet is pulled taut over an outer diameter of at least two (and preferably 4) bushings located in a pallet. The bushings are used through the remaining process steps for registering the sheet without having to revisit the registration holes of a sheet. In subsequent steps, an inner diameter of the bushings serves to receive a registration pin in the various assembly steps to thereby insure proper registration of the sheet. The sheet remains on the pallet until the individual cards are cut from the array.

Step 3: A pallet with a back sheet is moved to a station where UV adhesive is screened on back of the top sheet. The UV adhesive can be moisture or heat cured. A moisture cured adhesive will begin curing immediately and continue curing simply from moisture in the air.

Step 4: The pallet from step 3 is subjected to UV treatment which initiates preliminary polymerization to make the adhesive tacky.

Step 5: The pallet from step 4 is moved to a pick and place station. A completely populated flex circuit board with all of the electronics on it is placed on the tacky adhesive on the back of the top sheet. The UV adhesive is starting to moisture cure. The sheet is heated as it is moved to step 6 to assist with heat curing of the adhesive.

Step 6: The pallet from step 5 is moved into an injection molding station in which a pallet with a bottom sheet is placed on top of it and a plastic internal layer is injection molded between the two sheets.

Step 7. The sheets are now cut to make cards. This can be done by die punch or laser cut.

A key point in the foregoing process flow is that once the bottom (or top) sheet has a registration hole cut into it, that hole will be used once, and only once, to position the sheet against the pallet, and thereafter such registration will be maintained constant while further registration will be achieved by use of the inner diameter of the bushings. Because the bushings are physically and rigidly affixed to a pallet, the pallet on which the sheet has been placed can be physically moved between steps or operations and very precise registration can be maintained because registration of the bushings relative to the pallet and registration of the holes in the sheets relative to the bushings will not change. This also means that location of items placed on the sheets, such as electronics, will not change during manufacturing, because the sheets are maintained taut by their registration holes which are stretched over the bushings.

The invention will now be described in even greater detail with respect to certain of the steps already identified and operations performed in connection with certain of such steps. First, however, it is worth noting that a given sheet is best used to process an array of items, rather than just a single item, and in connection with the manufacture of cards, an array of six is common within the industry. It is also worth noting that the following description will describe use of one array of six items, but multiple arrays can be processed together on a single pallet, to increase production from a single manufacturing line. Accordingly, the use of a single array of six is meant to be illustrative, but not limiting.

FIGS. 1A and 1B illustrate a pallet 1 having four bushings 2, each of which has an outer diameter 20D and an inner diameter 21D, and an opening 3 for tooling. As is illustrated in FIG. 1B, each bushing 2 is rigidly held by pallet 1 and extends above a top surface 4 of pallet 1.

FIGS. 2A and 2B illustrate a sheet 10 pulled taut over outer diameter 20D of each bushing 2 (which is done in step 2) as well as a circuit array 11 mounted to sheet 10 (which is done in step 5). Circuit array 11 is illustrated by itself in FIG. 3 in which the individual components are not illustrated but, rather, for ease of understanding, are illustrated as having an outline of a card size, since the individual components themselves can vary, and the point is that a fully populated circuit array 11 is mounted to sheet 10 in pick and place step 5, which will now be described in greater detail.

In pick and place step 5, circuit array 11 must be precisely placed on top of sheet 10 and it has been found superior results are obtained when a vacuum chamber is used in connection with the placement portion of this step.

FIGS. 4A-4E illustrate how circuit array 11 is loaded onto a pick head, which is the pick portion of pick and placement step 5.

In FIG. 4A circuit array 11 is located on circuit locator nest 21 underneath pick head 25. Circuit locator nest 21 has two circuit locating pins 22 which are extended and hold circuit locating holes 12 and 13 (see FIG. 3) in circuit array 11. Pick head 25 has two guide pins 26 that are retracted.

Figure 4B:
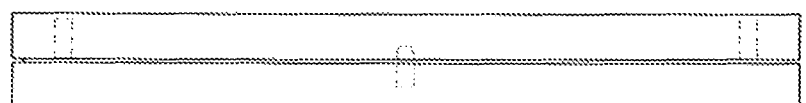

In FIG. 4B pick head 25 has come down.

Figure 4C:
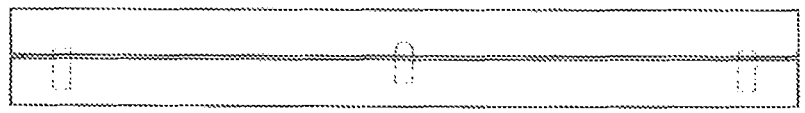

In FIG. 4C pick head guide pins 26 have been extended into circuit locator nest and into pick head guide holes 14 and 15 (see FIG. 3).

It should be noted that while circuit locating hole 13 and pick head guide hole 15 are labeled and described in this description as holes, they are in actuality, in an especially preferred embodiment, slots, as shown in FIG. 3.

Figure 4D:
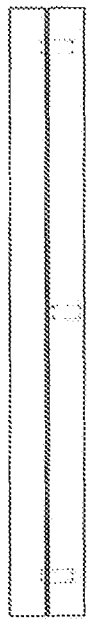

In FIG. 4D circuit locating pins 22 are retracted.

Figure 4E:
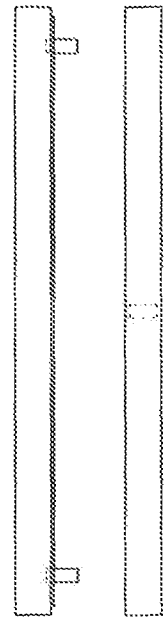

In FIG. 4E pick head 25 is lifted up away from circuit locator nest 21 with circuit array 11 attached to it.

Once circuit array 11 is attached to pick head 25, the pick portion of the pick and placement step 5 is complete, and then it will placed on top of sheet 10, which is illustrated in FIGS. 5A-5F. Registration between pick head 25 and sheet 10 is maintained through use of bushings 2 (not shown.) FIGS. 5A-5F include an adhesive layer 18 added by step 3 which has also been subjected to UV treatment in step 4. Note that the process is not limited to applications in which a UV cured adhesive is applied, and that such steps are being described solely in connection with an especially preferred manufacturing process.

Figure 5A:
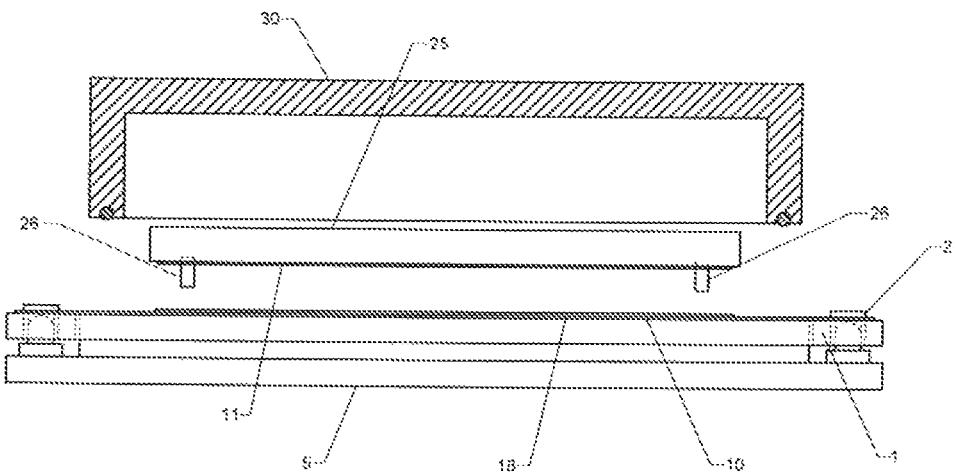
FIGS. 5A-F illustrate steps of a place operation, both of which are part of a step of pick and placing a circuit array on top of a sheet, the results of which are illustrated in FIG. 2A.

In FIG. 5A pick head 25 is located over sheet 10 (positioned on pallet 1) and vacuum chamber 30 is up. Pick head guide pins 26 are still extended.

Figure 5B:
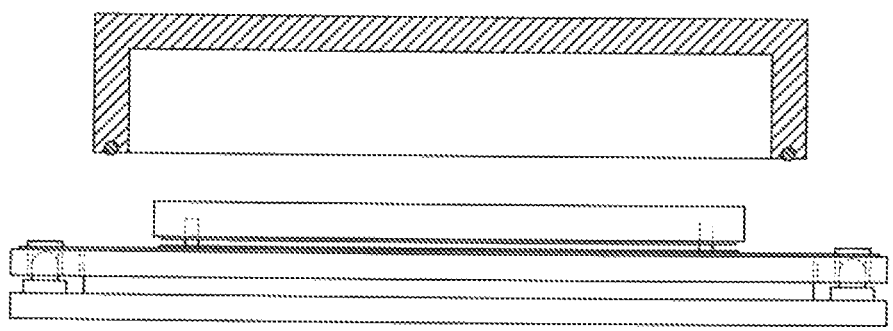

In FIG. 5B pick head 25 moves down to an intermediate position in which pick head guide pins 26 come in contact with sheet 10.

Figure 5C:
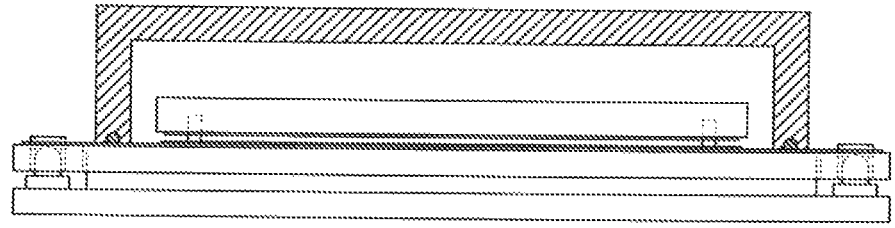

In FIG. 5C vacuum chamber 30 comes down on top of sheet 10, covering pick head 25, to mate with anvil 5 formed in opening 3 of pallet 1 and then air is removed inside of chamber 30 to create a vacuum. The vacuum helps to minimize air bubbles created between sheet 10 and circuit array 11 in subsequent steps.

Figure 5D:
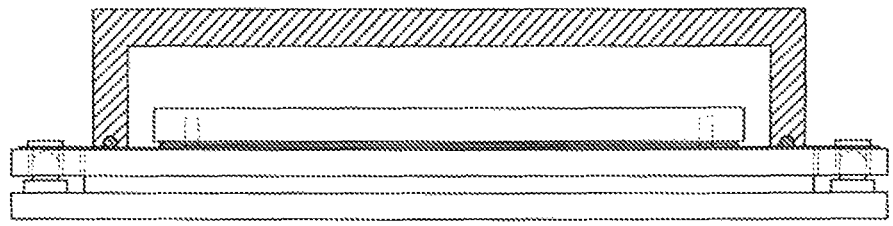

In FIG. 5D pick head 25 comes fully down so that circuit array 11 comes into contact with adhesive 18.

Figure 5E:
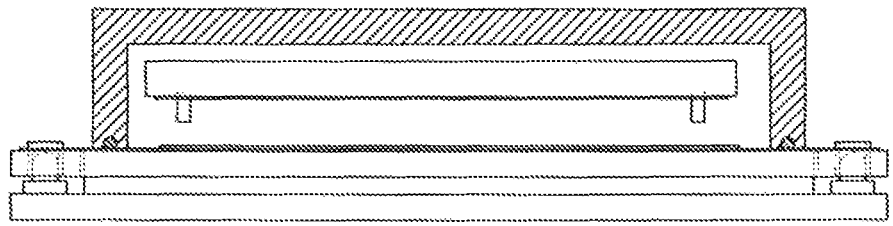

In FIG. 5E pick head 25 moves up, while there is still a vacuum, leaving circuit array 11 on adhesive 18, and then the vacuum is vented.

Figure 5F:
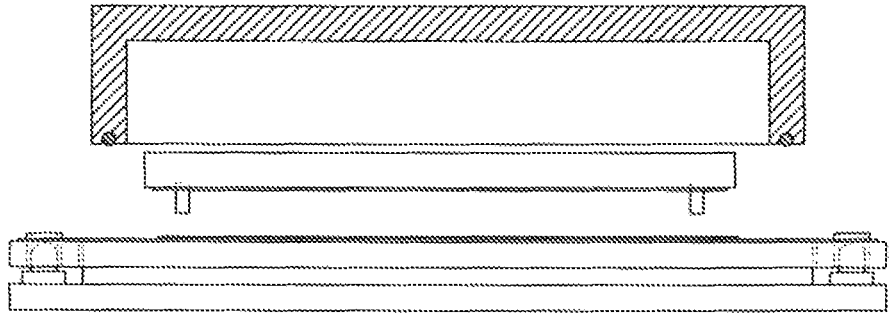

In FIG. 5F vacuum chamber 30 comes up.

While the present invention has been described herein with reference to certain preferred embodiments, these embodiments have been presented by way of example only, and not to limit the scope of the invention. For example, while the foregoing description sets forth a preferred embodiment useful for manufacturing cards, the process is not limited simply to manufacturing cards, and is applicable to any process in which polyurethane is injected between two very thin sheets of material (which might be plastic, metal or some other substance, or a combination of such compositions) having electronic components and it is desired that the polyurethane fully cure between the sheets to form a composite molded product in which any bubbles are minimized, nor is the present invention limited to cards which have plastic sheets, as the cards manufactured according to the present invention can have top and bottom sheets which are plastic, metal or a combination of plastic and metal (and potentially other types of materials). Additional embodiments thereof will be obvious to those skilled in the art having the benefit of this disclosure. Further modifications are also possible in alternative embodiments without departing from the inventive concepts disclosed herein.

Accordingly, it will be readily apparent to those skilled in the art that still further changes and modifications in the actual concepts described herein can readily be made without departing from the spirit and scope of the disclosed inventions.

What is claimed is:

1. A process for manufacturing a laminated article of manufacture, comprising the steps of:

cutting a plurality of registration holes in a sheet containing one or more arrays of outer layers for a plurality of laminated articles of manufacture;

mounting the sheet to a surface of a pallet having a plurality of bushings extending outwardly from the surface, each of said plurality of bushings having an outer diameter and an inner pin shaft, wherein the sheet is mounted to a moveable pallet so that each of the plurality of registration holes is held taut by the outer diameter of one of the plurality of bushings; and moving the pallet with the sheet mounted to the surface of the pallet through a plurality of process stations in which a plurality of operations are performed without removing the plurality of registration holes from the plurality of bushings so as to create a plurality of laminated articles of manufacture;

wherein the inner pin shaft of the plurality of bushings serve to receive a plurality of registration pins during the plurality of operations so as to provide registration of the sheet during said plurality of operations; and wherein the sheet is comprised of a thin flexible sheet.

2. The process of claim 1, wherein the plurality of holes is comprised of four holes.

3. The process of claim 1, wherein the laminated article of manufacture is a payment card.

4. The process of claim 1, wherein an array is comprised of six outer layers.

5. The process of claim 1, wherein the plurality of operations is comprised of:

securing at least one electronic component to each of the outer layers in the array;

injecting a urethane material into a mold containing the sheet; and separating each of the plurality of laminated articles of manufacture from the sheet.

6. The process of claim 5, wherein the operation of securing at least one electronic component to each of the outer layers in the array is comprised of the steps of:

applying an adhesive to a top side of the sheet; and applying a completely populated flex circuit to the top side of the sheet.

7. The process of claim 5, wherein the plurality of operations includes adding a second sheet containing at least one second array of outer layers for a plurality of laminated articles of manufacture to the mold.

8. A process for manufacturing payment cards, comprising the steps of:

cutting four registration holes in a sheet containing an array of outer layers for a plurality of payment cards;

mounting the sheet to a surface of a pallet having four bushings extending outwardly from the surface, each of said bushings having an outer diameter and an inner pin shaft, wherein the sheet is mounted to the moveable pallet so that each registration hole is held taut by the outer diameter of one of bushings; and moving the pallet with the sheet mounted to the surface of the pallet through a plurality of process stations in which a plurality of operations are performed without removing the registration holes from the bushings, wherein registration of the sheet during said plurality of operations is maintained by use of a plurality of registration pins received by two or more of said four bushings;

wherein the plurality of operations is comprised of:

applying a UV curing adhesive to a top surface of the sheet;

subjecting the top surface of the sheet to a UV treatment;

adding a completely populated flex circuit board to the top surface of each of the array of outer layers;

injecting a urethane mixture into a mold containing the sheet and a second sheet containing a second array of outer layers for the plurality of payment cards to form a laminated array; and separating each of the plurality of payment cards from the laminated array;

wherein the sheet is comprised of a thin flexible sheet.

9. The process of claim 8, wherein the pallet is physically moved between a first step in which the sheet is mounted to the pallet and a second step when the UV curing adhesive is applied to the top surface of the sheet, between the second step and a third step when a completely populated flex circuit board is added, between the third step and a fourth step when the laminated array is formed, and between the fourth step and fifth step when the plurality of payment cards are separated from the laminated array.

* * * * *